United States Patent
Ikeda et al.

(10) Patent No.: US 9,725,826 B2
(45) Date of Patent: Aug. 8, 2017

(54) SINGLE-CRYSTAL DIAMOND AND MANUFACTURING METHOD THEREOF

(75) Inventors: Kazuhiro Ikeda, Itami (JP); Hitoshi Sumiya, Itami (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 509 days.

(21) Appl. No.: 14/241,855

(22) PCT Filed: Aug. 30, 2012

(86) PCT No.: PCT/JP2012/072042
§ 371 (c)(1),
(2), (4) Date: Feb. 27, 2014

(87) PCT Pub. No.: WO2013/031907
PCT Pub. Date: Mar. 7, 2013

(65) Prior Publication Data
US 2014/0219907 A1 Aug. 7, 2014

(30) Foreign Application Priority Data

Sep. 2, 2011 (JP) .................................. 2011-191901
Mar. 27, 2012 (JP) .................................. 2012-071643

(51) Int. Cl.
C30B 29/04 (2006.01)
C30B 25/00 (2006.01)
(Continued)

(52) U.S. Cl.
CPC ............... *C30B 29/04* (2013.01); *B01J 3/062* (2013.01); *C30B 7/10* (2013.01); *C30B 25/00* (2013.01);
(Continued)

(58) Field of Classification Search
None
See application file for complete search history.

(56) References Cited

U.S. PATENT DOCUMENTS 5,310,447 A 5/1994 Anthony et al.
6,162,412 A 12/2000 Fujimori et al.
(Continued)

FOREIGN PATENT DOCUMENTS

EP 0469626 B1 4/1998
EP 0894766 A1 2/1999
(Continued)

OTHER PUBLICATIONS

Sumiya et al., "High-pressure synthesis of high-purity diamond crystal", Diamond and Related Materials, Elsevier Science S.A., vol. 5, 1996, pp. 1359-1365.
(Continued)

*Primary Examiner* — Guinever S Gregorio
(74) *Attorney, Agent, or Firm* — Venable LLP; Michael A. Sartori; F. Brock Riggs

(57) ABSTRACT

Single-crystal diamond is composed of carbon in which a concentration of a carbon isotope $^{12}C$ is not lower than 99.9 mass % and a plurality of inevitable impurities other than carbon. The inevitable impurities include nitrogen, boron, hydrogen, and nickel, and a total content of nitrogen, boron, and hydrogen of the plurality of inevitable impurities is not higher than 0.01 mass %. In order to manufacture single-crystal diamond, initially, a hydrocarbon gas in which a concentration of the carbon isotope $^{12}C$ is not lower than 99.9 mass % is subjected to denitrification.

8 Claims, 2 Drawing Sheets

(51) Int. Cl.
*B01J 3/06* (2006.01)
*C30B 7/10* (2006.01)

(52) U.S. Cl.
CPC .... *B01J 2203/061* (2013.01); *B01J 2203/062* (2013.01); *B01J 2203/068* (2013.01); *B01J 2203/0655* (2013.01)

(56) References Cited

U.S. PATENT DOCUMENTS

| | | | |
|---|---|---|---|
| 6,858,080 B2* | 2/2005 | Linares | C30B 25/02 117/104 |
| 2007/0033810 A1 | 2/2007 | Sumiya et al. | |
| 2008/0311023 A1* | 12/2008 | Yamamoto | C30B 25/105 423/446 |

FOREIGN PATENT DOCUMENTS

| | | |
|---|---|---|
| GB | 2 247 561 A | 3/1992 |
| JP | 04-092894 A | 3/1992 |
| JP | 04-092896 A | 3/1992 |
| JP | 04-108532 A | 4/1992 |
| JP | 04-234001 A | 8/1992 |
| JP | 08-141385 A | 6/1996 |
| JP | 2003-137686 A | 5/2003 |
| JP | 2004-538230 A | 12/2004 |
| WO | WO-03/014427 A1 | 2/2003 |
| WO | WO-2005/035174 A1 | 4/2005 |
| WO | WO-2010/010352 A1 | 1/2010 |

OTHER PUBLICATIONS

Markham et al., "CVD diamond for spintronics", Diamond & Related Materials, Elsevier B.V., vol. 20, Nov. 27, 2010, pp. 134-139.

Ramdas et al., "Effect of Isotopic Constitution of Diamond on Its Elastic Constants: $^{13}$C Diamond, the Hardest Known Material", Physical Review Letters, The American Physical Society, vol. 17, No. 1, Jul. 5, 1993, pp. 189-192.

Extended European Search Report in European Patent Application No. 12828541.8, dated Jan. 23, 2015.

Sumiya, "Thermally activated deformation under Knoop indentations in super-hard directions of high-quality synthetic type-IIa diamond crystals," Diamond and Related Materials, 15 (2006), pp. 1576-1579.

Anthony et al., "Properties of diamond with varying isotopic composition," Diamond and Related Materials, 1 (1992), pp. 717-726.

International Search Report in PCT International Application No. PCT/JP2012/072042, dated Nov. 27, 2012.

Notification of the First Office Action in Chinese Patent Application No. 2012800425532, dated Nov. 4, 2015.

* cited by examiner

SINGLE-CRYSTAL DIAMOND AND MANUFACTURING METHOD THEREOF

TECHNICAL FIELD

The present invention relates to single-crystal diamond and a manufacturing method thereof, and particularly to single-crystal diamond having high purity and high hardness and a manufacturing method thereof.

BACKGROUND ART

Single-crystal diamond has been made use of, for example, in various fields related to tools such as cutting tools, acoustics, optics, electronic devices, and the like. This single-crystal diamond includes what is called IIa-type diamond and Ib-type diamond. The IIa-type diamond is high-purity diamond containing substantially no nitrogen representing an impurity, and the Ib-type diamond is an impurity-containing diamond containing nitrogen representing an impurity by approximately 0.1%. It has been known that IIa-type diamond is harder than Ib-type diamond based on comparison of hardness of these diamonds.

For example, H. Sumiya, Diamond & Related Materials 15 (2006) 1576-1579 (NPD 1) describes IIa-type diamond of which Knoop hardness varies with a temperature.

On the other hand, $^{12}C$ and $^{13}C$ have been known as carbon isotopes. For example, Japanese Patent Laying-Open No. 4-92894 (PTD 1) and Japanese Patent Laying-Open No. 4-92896 (PTD 2) describe that vapor-phase synthesized diamond excellent in thermal conductivity can be obtained by adjusting a content of this carbon isotope $^{12}C$ or $^{13}C$ and a content of nitrogen.

CITATION LIST

Patent Document

PTD 1: Japanese Patent Laying-Open No. 4-92894
PTD 2: Japanese Patent Laying-Open No. 4-92896

Non Patent Document

NPD 1: H. Sumiya, Diamond & Related Materials 15 (2006) 1576-1579
NPD 2: T. R Anthony et al., Diamond & Related Materials 1 (1992) 717-726

SUMMARY OF INVENTION

Technical Problem

As described in PTDs 1 and 2 above, in conventional diamond containing a carbon isotope, from a point of view of improvement in thermal conductivity, a content of a carbon isotope or nitrogen in diamond has been devised. The inventions described in these documents, however, basically define a concentration of a carbon isotope or nitrogen in order to improve thermal conductivity of diamond but do not define a concentration of a carbon isotope or nitrogen in order to increase hardness of diamond.

Hardness of diamond is believed to become higher as a concentration of a carbon isotope $^{13}C$ is higher. This is because a higher content of a carbon isotope $^{13}C$ is theoretically considered to lead to stronger bond and higher hardness of diamond. However, since a carbon isotope $^{13}C$ is present at a natural abundance ratio only of 1.1%, high cost is required for increasing a concentration of the carbon isotope $^{13}C$. Therefore, it is not industrially practical to simply increase a concentration of the carbon isotope $^{13}C$ so as to increase hardness of diamond. In addition, it has been reported as in T. R Anthony et al., Diamond & Related Materials 1 (1992) 717-726 that, even though a concentration of the carbon isotope $^{13}C$ was actually increased, there was not much difference from diamond having a natural abundance ratio thereof. This was caused by the fact that an impurity other than an isotope had not sufficiently been removed from diamond in NPD 2.

In addition, as a result of studies conducted by the inventors of the present application, it was found that presence of nickel (Ni) as an impurity adversely affected high-temperature hardness characteristics of single-crystal diamond fabricated with a carbon isotope being enriched.

Then, one object of the present invention is to provide single-crystal diamond capable of achieving higher hardness with the use of a carbon isotope $^{12}C$ and a method of manufacturing the same. Another object of the present invention is to provide single-crystal diamond capable of achieving higher hardness of diamond with the use of a carbon isotope $^{12}C$ and then achieving also high-temperature hardness characteristics by appropriately adjusting an impurity and a method of manufacturing the same.

Solution to Problem

Single-crystal diamond in one aspect of the present invention is composed of carbon in which a concentration of a carbon isotope $^{12}C$ is not lower than 99.9 mass % and a plurality of inevitable impurities other than carbon. The inevitable impurities include nitrogen, boron, hydrogen, and nickel, and a total content of nitrogen, boron, and hydrogen of the plurality of inevitable impurities is not higher than 0.01 mass %. It is noted that carbon in which a concentration of a carbon isotope $^{12}C$ is not lower than 99.9 mass % means that a content of a carbon isotope (such as $^{13}C$ and $^{14}C$) other than the carbon isotope $^{12}C$ is low and a concentration of those isotopes in carbon is lower than 0.1 mass % even in total.

A content of nitrogen and boron is preferably lower than a content of hydrogen. In addition, the inevitable impurities may include, for example, nitrogen not higher than 0.0001 mass %, boron not higher than 0.0001 mass %, hydrogen lower than 0.01 mass %, and nickel not higher than 0.00001 mass %. The single-crystal diamond preferably has Knoop hardness not lower than 130 GPa. Preferably, a threshold value at which lowering in Knoop hardness occurs in a <110> direction in a (001) plane of the single-crystal diamond exceeds 240° C.

A method of manufacturing single-crystal diamond in one aspect of the present invention includes the steps of, by using a hydrocarbon gas subjected to denitrification in which a concentration of a carbon isotope $^{12}C$ is not lower than 99.9 mass %, in a vacuum chamber at a temperature not lower than 600° C. and not higher than 2300° C., preparing diamond synthesized through vapor-phase synthesis, or a carbon source material in which an amount of an impurity other than carbon is not higher than 0.01 mass % by annealing the diamond at a temperature not lower than 1800° C., or a carbon source material such as graphite obtained by thermal decomposition of the hydrocarbon gas on a base material, cutting a seed crystal from solid carbon obtained by using the carbon source material, and growing single-crystal diamond from the seed crystal with a high-temperature and high-pressure synthesis method while the seed crystal is accommodated in a cell together with a solvent and the carbon source material.

The cell can be formed, for example, of carbon-free Fe. In this case, preferably, introduction of a carbon isotope $^{13}C$ and nitrogen in atmosphere into the cell is prevented by sealing the cell in vacuum not higher than $10^{-3}$ Pa after the seed crystal, the solvent, and the carbon source material are accommodated in the cell. In addition, preferably, a surface of a heater used in the high-temperature and high-pressure synthesis method is coated with solid carbon such as graphite, diamond-like carbon, vapor-phase synthesized diamond, or thermally decomposed carbon, in which a concentration of the carbon isotope $^{12}C$ is not lower than 99.9 mass % and an impurity other than carbon is not higher than 0.01 mass %. For example, an alloy material in which Ti particles having a crystal grain size not smaller than 100 μm and not greater than 150 μm have been precipitated in an Fe—Co alloy can be employed as the solvent.

Single-crystal diamond in another aspect of the present invention is composed of carbon in which a concentration of a carbon isotope $^{12}C$ is not lower than 99.9 mass % and a plurality of inevitable impurities other than carbon. The inevitable impurities include nitrogen, boron, and hydrogen but do not include Ni, and a total content of nitrogen, boron, and hydrogen of the plurality of inevitable impurities is not higher than 0.01 mass %. It is noted that carbon in which a concentration of a carbon isotope $^{12}C$ is not lower than 99.9 mass % means that a content of a carbon isotope (such as $^{13}C$ and $^{14}C$) other than the carbon isotope $^{12}C$ is low and a concentration of those isotopes in carbon is lower than 0.1 mass % even in total.

Preferably, a content of nitrogen and boron is lower than a content of hydrogen. In addition, the inevitable impurities may include nitrogen not higher than 0.0001 mass %, boron not higher than 0.0001 mass %, and hydrogen lower than 0.01 mass %. The single-crystal diamond preferably has Knoop hardness not lower than 130 GPa. Preferably, a threshold value at which lowering in Knoop hardness occurs in a <110> direction in a (001) plane of the single-crystal diamond exceeds 400° C.

A method of manufacturing single-crystal diamond in another aspect of the present invention includes the steps of, by using a hydrocarbon gas subjected to denitrification in which a concentration of a carbon isotope $^{12}C$ is not lower than 99.9 mass %, in a vacuum atmosphere or in an inert gas atmosphere at a temperature not lower than 600° C. and not higher than 2300° C., preparing a carbon material synthesized through vapor-phase synthesis, or a carbon source material in which an amount of an impurity other than carbon is not higher than 0.01 mass % by annealing the carbon material at a temperature not lower than 1800° C., or a carbon source material such as graphite obtained by thermal decomposition of the hydrocarbon gas on a base material not containing Ni, cutting a seed crystal from solid carbon obtained by using the carbon source material, and growing single-crystal diamond from the seed crystal with a high-temperature and high-pressure synthesis method while the seed crystal is accommodated in a cell together with a solvent not containing Ni and the carbon source material.

The cell can be formed, for example, of carbon-free iron (Fe). In this case, preferably, introduction of a carbon isotope $^{13}C$ and nitrogen in atmosphere into the cell is prevented by sealing the cell in vacuum not higher than $10^{-3}$ Pa after the seed crystal, the solvent, and the carbon source material are accommodated in the cell. In addition, preferably, a surface of a heater used in the high-temperature and high-pressure synthesis method is coated with solid carbon such as graphite, diamond-like carbon, vapor-phase synthesized diamond, or thermally decomposed carbon, in which a concentration of the carbon isotope $^{12}C$ is not lower than 99.9 mass % and an amount of an impurity other than carbon is not higher than 0.01 mass %.

Advantageous Effects of Invention

In single-crystal diamond in one aspect of the present invention, a concentration of a carbon isotope $^{12}C$ in carbon is increased to 99.9 mass % or higher and a content of an inevitable impurity is extremely lowered to 0.01 mass % or lower, so that hardness of single-crystal diamond can be increased and lowering in hardness due to a temperature can be suppressed. It has been reported as in NPD 2 that, even though a concentration of a carbon isotope $^{13}C$ was increased with the expectation of achieving higher hardness, there was not much difference from diamond in which a ratio of a carbon isotope was equal to a natural abundance ratio. The present invention is based on the finding obtained for the first time by discovering the fact that failure in achieving high hardness of diamond as expected as described in NPD 2 was caused by insufficient removal of an impurity other than a carbon isotope. Namely, such an effect has been clarified that even the carbon isotope $^{12}C$ which had been considered as not high in hardness can be higher in hardness than diamond in which a ratio of a carbon isotope is equal to a natural abundance ratio and in addition, high-temperature hardness characteristics can also be higher.

In the method of manufacturing single-crystal diamond in one aspect of the present invention, since isotope-enriched high-purity carbon represented by carbon, graphite obtained by thermal decomposition of a hydrocarbon gas subjected to denitrification in which a concentration of a carbon isotope $^{12}C$ is not lower than 99.9 mass %, or vapor-phase synthesized diamond, or solid carbon obtained by degassing the vapor-phase synthesized diamond at a high temperature is formed, a carbon material which contains a high-purity carbon isotope $^{12}C$ not lower than 99.9 mass % and is extremely low in content of an inevitable impurity can be obtained. Then, since single-crystal diamond is grown from a seed crystal cut from diamond synthesized from that carbon material, high-hardness single-crystal diamond which contains a high-purity carbon isotope $^{12}C$ and is extremely low in content of an inevitable impurity as above can be obtained.

In single-crystal diamond in another aspect of the present invention, a concentration of a carbon isotope $^{12}C$ in carbon is increased to 99.9 mass % or higher, a content of an inevitable impurity is extremely lowered to 0.01 mass % or lower, and no Ni is contained, so that high-temperature hardness characteristics of single-crystal diamond can also be enhanced while high hardness of single-crystal diamond is achieved.

In the method of manufacturing single-crystal diamond in another aspect of the present invention, isotope-enriched high-purity carbon represented by carbon, or graphite obtained by thermal decomposition of a hydrocarbon gas subjected to denitrification in which a concentration of a carbon isotope $^{12}C$ is not lower than 99.9 mass % on a substrate not containing Ni, or vapor-phase synthesized diamond obtained in a vacuum atmosphere or in an inert gas atmosphere, or solid carbon obtained by degassing vapor-phase synthesized diamond at a high temperature is formed, and therefore, a carbon material which contains a high-purity carbon isotope $^{12}C$ not lower than 99.9 mass %, is extremely low in content of an inevitable impurity, and does not contain Ni can be obtained. Then, since single-crystal diamond is grown from a seed crystal cut from diamond synthesized from that carbon material with the use of a solvent not containing Ni and a carbon material, high-hardness single-crystal diamond which contains a high-purity carbon isotope $^{12}$C, is extremely low in content of an inevitable impurity, and does not contain Ni as above can be obtained.

DESCRIPTION OF EMBODIMENTS

Figure 1:
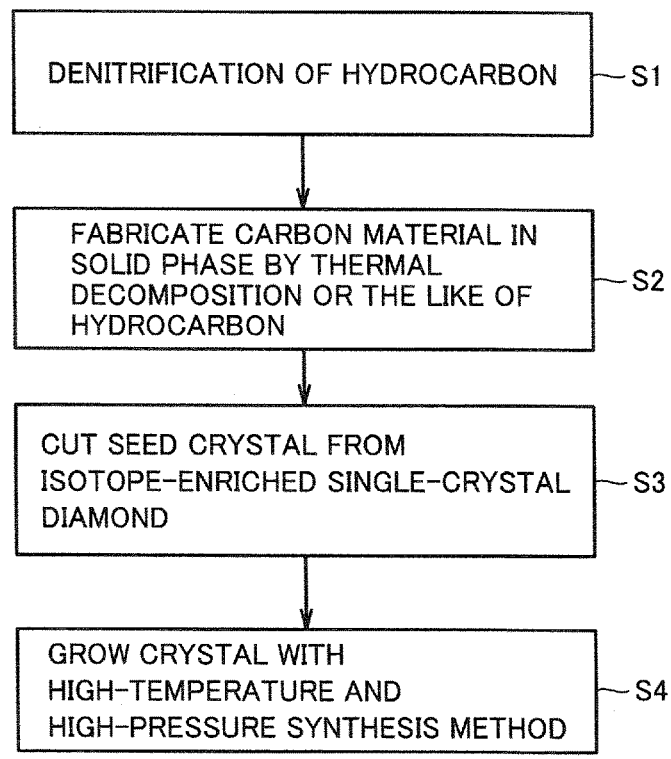
FIG. 1 is a diagram showing a flow of manufacturing single-crystal diamond in one embodiment of the present invention.

One embodiment of the present invention will be described hereinafter with reference to FIG. 1.

Single-crystal diamond in the present embodiment is higher in hardness than conventional general single-crystal diamond by increasing a concentration of a carbon isotope $^{12}$C in carbon forming a diamond main body and by extremely lowering a concentration of an inevitable impurity in diamond. Specifically, single-crystal diamond according to the present embodiment is composed of carbon in which a concentration of a carbon isotope $^{12}$C is not lower than 99.9 mass % and a plurality of inevitable impurities other than carbon.

It has conventionally and generally been considered that increase in concentration of a carbon isotope $^{13}$C in diamond can contribute more to increase in hardness of single-crystal diamond than increase in concentration of a carbon isotope $^{12}$C in diamond. In contrast to this concept, however, the present invention is characterized by increasing hardness of single-crystal diamond by increasing a concentration of a carbon isotope $^{12}$C in diamond.

Simply increasing a concentration of a carbon isotope $^{12}$C in diamond cannot increase hardness of single-crystal diamond. As a result of studies conducted by the inventors of the present application, however, it has been found that hardness of single-crystal diamond can be increased by increasing a concentration of a carbon isotope $^{12}$C in diamond and lowering a concentration of an inevitable impurity to below a prescribed level.

The inevitable impurity can typically be exemplified by nitrogen, boron, hydrogen, nickel, and the like, and a total content of these inevitable impurities is set to 0.01 mass % or lower. For example, a total content of nitrogen, boron, and hydrogen of a plurality of inevitable impurities is set to 0.01 mass % or lower. Namely, a concentration of an impurity in diamond is approximately not higher than a detection limit in SIMS (Secondary Ion Mass Spectrometry) analysis. A concentration of a transition metal in diamond is approximately not higher than a detection limit in ICP (Inductively Coupled Plasma) analysis or SIMS analysis. In the present embodiment, in particular, a content of nitrogen, boron, nickel, and the like is preferably significantly lowered.

By increasing a concentration of a carbon isotope $^{12}$C (purity of a carbon isotope) in diamond and setting a content of an inevitable impurity to an unprecedented low level as above, non-uniformity in a diamond crystal can be extremely low and bond between crystal lattices can be stronger. Namely, though a bond length or a mass is different between a carbon isotope $^{12}$C and a carbon isotope $^{13}$C, non-uniformity in bond length caused thereby is substantially eliminated, so that there will be extremely few starting points of breakage of interatomic bond against external force. Consequently, single-crystal diamond higher in hardness by at least 5% than conventional single-crystal diamond containing a carbon isotope $^{13}$C around 1.1% (a natural abundance ratio) could be synthesized.

It is noted that hardness of single-crystal diamond in which a carbon isotope $^{12}$C has simply been highly enriched is equal to or slightly lower in value than hardness of single-crystal diamond synthesized with carbon at a natural abundance ratio serving as a carbon source. In addition, in a case that an isotope is enriched with a CVD (Chemical Vapor Deposition) method as well, hardness of single-crystal diamond was lower than in the present embodiment, for such a reason that introduction of hydrogen in diamond is inevitable or crystallinity is poorer than a high-temperature and high-pressure single crystal.

In single-crystal diamond in the present embodiment, for example, a concentration of nitrogen is not lower than 0.000001 mass % (0.01 ppm) and not higher than 0.0001 mass % (1 ppm), a concentration of boron is not higher than 0.0001 mass % (1 ppm), a concentration of hydrogen is lower than 0.01 mass %, and a concentration of nickel is not higher than 0.00001 mass % (0.1 ppm).

As above, preferably, a content of nitrogen and boron in diamond is lower than a content of hydrogen. In the present embodiment, a content of nitrogen and boron in diamond is approximately not higher than 1/100 of a content of hydrogen. In addition, preferably, a content of nickel is also equal to or lower than that of nitrogen or boron. In the present embodiment, a content of nickel is approximately not higher than 1/1000 of a content of hydrogen and approximately not higher than 1/10 of a content of nitrogen or boron.

As above, by increasing a concentration of a carbon isotope $^{12}$C in diamond and lowering a concentration of an inevitable impurity, hardness of single-crystal diamond in the present embodiment can be 130 GPa or higher. This value can be concluded as a value dominantly higher than hardness of general high-purity diamond (approximately from 100 to 120 GPa).

Based on measurement of Knoop hardness in a <110> direction in a (001) plane of diamond, single-crystal diamond synthesized in similar steps except for a source material and a seed crystal and composed of a carbon isotope at a ratio as high as a natural abundance ratio has a threshold value in a range from 200 to 230° C. as shown in NPD 1 and indentation appears.

In contrast, in single-crystal diamond in the present embodiment, a threshold temperature described above is also as high as approximately from 240 to 400° C. Surprisingly, lowering in Knoop hardness was hardly observed at least up to 450° C., up to which we could conduct measurement. Here, a temperature of 450° C. is mentioned because, at a temperature equal to or higher than 450° C., an indenter, that is, a synthesized Ha single crystal, could not withstand and measurement could no longer be conducted. Namely, the finding that single-crystal diamond in the present embodiment was better also in high-temperature characteristics than single-crystal diamond present so far was obtained. Specifically, a ratio of Knoop hardness in a range from 240° C. to 400° C. to Knoop hardness at room temperature in a <110> direction in a (001) plane of single-crystal diamond in the present embodiment is not lower than 0.95.

A method of manufacturing single-crystal diamond in the present embodiment will now be described with reference to FIG. 1.

In order to fabricate single-crystal diamond in the present embodiment, a hydrocarbon gas in which a concentration of a carbon isotope $^{12}C$ is not lower than 99.9 mass % is prepared. For example, a methane gas can be employed as the hydrocarbon gas.

Then, as shown in FIG. 1, the hydrocarbon gas is subjected to denitrification (step S1). For example, a denitrification filter is used to subject the hydrocarbon gas to denitrification. For a denitrification filter, porous titanium called "sponge titanium" can be employed. Here, "sponge titanium" is pure titanium which is first produced when titanium is made use of as a metal. This "sponge titanium" can be fabricated by reducing titanium tetrachloride with magnesium. "Sponge titanium" above is heated to 300° C. to 900° C. (preferably 500° C. or higher) and this heated "sponge titanium" is brought in contact with the hydrocarbon gas, so that "sponge titanium" can react with nitrogen and nitrogen can be removed from the hydrocarbon gas.

The hydrocarbon gas subjected to denitrification as above is introduced in a vacuum chamber, and in the vacuum chamber, vapor-phase synthesized diamond is synthesized at a temperature approximately not lower than 600° C. and not higher than 1300° C. or the hydrocarbon gas is thermally decomposed on a base material at a temperature not lower than 1200° C. and not higher than 2300° C. For example, as shown in FIG. 1, graphite in a solid phase (solid carbon) can be fabricated on a base material (step S2). A concentration of a carbon isotope $^{12}C$ in graphite is not lower than 99.9 mass %. It is noted that a degree of vacuum within the vacuum chamber during generation of graphite is desirably set, for example, approximately to 20 to 100 Torr.

Thus, since diamond is vapor-phase synthesized from the hydrocarbon gas in a vapor-phase state in the vacuum chamber or a carbon material in a solid phase is fabricated on a base material through thermal decomposition, an amount of an impurity contained in the carbon material can extremely be reduced as described above.

In thermal decomposition of the hydrocarbon gas, the hydrocarbon gas is preferably fed toward the base material. The hydrocarbon gas may be supplied to the base material from above or may be supplied toward the base material in a diagonal direction or a lateral direction.

For the base material, for example, Ta, W, Re, or carbide thereof can be employed. In addition, a material obtained by peeling off from the base material, a carbon material such as graphite formed on this base material can also be employed as a base material. In this case, a carbon material small in an amount of an impurity can be employed as a base material, and introduction of an impurity into a carbon material such as graphite formed thereon can further effectively be suppressed.

In forming a carbon material such as graphite on a base material, for example, the base material set in the vacuum chamber is desirably heated to a temperature not lower than 1200° C. The base material is heated preferably approximately to 1500° C. to 2000° C. and more preferably approximately to 1900° C. to 2000° C. A well known technique can be adopted as a heating method. For example, it is possible that a heater capable of directly or indirectly heating the base material to a temperature not lower than 1200° C. is provided in the vacuum chamber. It is noted that such a condition as a temperature or a pressure should appropriately be adjusted in order to form a portion to serve as a seed crystal which will be described later in a carbon material.

Preferably, density of the carbon material such as graphite described above is not lower than 1.4 g/cm³. Thus, even though volume change due to compression during high-temperature and high-pressure synthesis occurs, deformation of a heater due to abnormal deformation of a cell or interference or failure in crystal growth due to change in resistance caused thereby can be suppressed.

Then, single-crystal diamond in which an isotope is enriched with a high-temperature and high-pressure synthesis method (for example, not lower than 5 GPa and not lower than 1300° C.) is synthesized from a carbon material such as graphite described above as a carbon source. As shown in FIG. 1, for example, laser is used to cut a seed crystal from high-purity single-crystal diamond in which an isotope has been enriched (step S3). Single-crystal diamond is, for example, in a flat plate shape and includes a single-crystal portion having low strain. A size of a single crystal is preferably greater than 0.5 mm×0.5 mm. A seed crystal of low strain is cut from this single-crystal diamond. More specifically, a single-crystal portion including a (100) plane is cut from single-crystal diamond.

Here, preferably, a portion in the (100) plane extremely low in strain is selected and cut after checking with a polarizing microscope, and this portion is used as a seed crystal.

In a portion relatively high in strain, not only a concentration of the carbon isotope $^{12}C$ is low but also aggregation or the like of an impurity such as nitrogen occurs. In addition, strain in a seed crystal is reflected during growth of a diamond crystal and a newly grown crystal also has strain, and thus an impurity also tends to be introduced in the diamond crystal. Thus, when a portion relatively high in strain is cut and used, non-uniformity of a diamond crystal is high, and consequently hardness of diamond is lowered.

While the seed crystal described above is accommodated in a cell together with a solvent and a carbon source, single-crystal diamond is grown from the seed crystal with the high-temperature and high-pressure synthesis method (for example, not lower than 5 GPa and not lower than 1300° C.) as shown in FIG. 1 (step S4).

As a solvent, an alloy material in which Ti particles having a particle size (an average particle size) not smaller than 100 μm and not greater than 150 μm are present as dispersed in a high-purity Fe—Co alloy can be employed. By employing this alloy material as a solvent, denitrification can be carried out while inclusion of an impurity during high-temperature and high-pressure synthesis is suppressed. It is noted that, when a particle size of Ti was greater than the range above, crystal growth tended to be interfered. Alternatively, when a Ti particle size was smaller than the range above, an amount of removal of nitrogen was insufficient. Ti particles are considered to adsorb not only nitrogen but also oxygen and to oxidize even the inside of Ti particles.

The synthesized solvent can be composed, for example, of carbon-free Fe. For example, graphite in which an isotope has been enriched can be used as the carbon source.

In synthesizing single-crystal diamond, a diamond synthesis system in which a seed crystal, a solvent, and the carbon source are arranged sequentially from below is accommodated in a cell. For example, a cup-shaped cell can be employed as the cell. An upper surface of this cell is sealed in vacuum not higher than $10^{-3}$ Pa. Thus, introduction of a carbon isotope $^{13}C$ and nitrogen in atmosphere into the cell can be suppressed and the inside of the cell can be set substantially to a vacuum state. Thus, introduction of an impurity gas such as CO, $CO_2$, $NO_x$, and $H_2O$ included in atmosphere can be suppressed.

Before the method as above is adopted, even with the use of a carbon source in which a concentration of a carbon isotope $^{12}C$ is 99.999%, there has been even a case that a concentration of a carbon isotope $^{12}C$ in an obtained diamond crystal lowers approximately to 99%. In the present embodiment, however, with vacuum sealing as above, a concentration of a carbon isotope $^{12}C$ in an obtained diamond crystal can be not lower than 99.9%. In addition, nitrogen can also be suppressed to a ppb order.

A surface of a heater used in the high-temperature and high-pressure synthesis method is preferably coated with thermally decomposed carbon, graphite, diamond-like carbon, or vapor-phase synthesized diamond, in which a concentration of a carbon isotope $^{12}C$ is not lower than 99.9 mass % and an impurity other than carbon is not higher than 0.01 mass %. Thus, introduction of a carbon isotope $^{13}C$ from ambience into a diamond crystal can be suppressed.

For example, natural graphite can be used for a heater. Since this heater contains carbon by 1.1% or higher, introduction of carbon in the heater into diamond is a serious issue in achieving a higher concentration of a carbon isotope $^{12}C$.

Then, adoption of the following three techniques is considered. Initially, a first technique is a technique for forming a graphite layer on a surface of a heater by heating a surface of the heater in advance and blowing thereto a methane gas in which a carbon isotope $^{12}C$ has been enriched.

A second technique is a method of coating a surface of a heater with a sputtering method, with graphite synthesized with a carbon isotope $^{12}C$ obtained from a methane gas in which a carbon isotope $^{12}C$ has been enriched serving as a sputtering target.

A third technique is similar to a method of coating a sample with graphite during observation with an SEM (Scanning Electron Microscope) or the like. Namely, it is a method of coating a heater with graphite in which a carbon isotope $^{12}C$ has been enriched by employing as an electrode, graphite synthesized with a carbon isotope $^{12}C$ obtained from a methane gas in which a carbon isotope $^{12}C$ has been enriched and causing discharge between the electrodes.

Limitation to the three methods above, however, is not intended, and an effect is obtained in any of a case that the heater is coated with graphite with any method, a case that the entire heater is fabricated with graphite in which an isotope has been enriched, and a case that the heater is fabricated with solid carbon such as diamond-like carbon or diamond.

It is noted that single-crystal diamond in the present embodiment should only be grown from a seed crystal, for example, at 5 GPa or higher and at a temperature not lower than 1350° C.

An example of single-crystal diamond and a method of manufacturing the same relating to one embodiment of the present invention will be described below.

Example 1

Nitrogen is removed from a methane gas by passing the methane gas in which a concentration of a carbon isotope $^{12}C$ is 99.9% through sponge titanium heated to 600° C. or higher. This methane gas from which nitrogen has been removed is blown onto a Ta substrate heated to a high temperature of 1900° C. within a vacuum chamber. Thus, the methane gas is decomposed on the Ta substrate so that graphite having a size of 10 mm×10 mm, in which a concentration of the carbon isotope $^{12}C$ is not lower than 99.9% is formed on the Ta substrate. Here, a pressure in the vacuum chamber is set approximately to $10^2$ to $10^4$ Pa. High-purity diamond is synthesized with the high-temperature and high-pressure synthesis method by using this graphite as a carbon source.

High-purity diamond in which an isotope has been enriched is observed with a polarizing microscope, a portion in a (100) plane extremely low in strain, having a size not smaller than 0.5 mm×0.5 mm, is cut, and this portion is employed as a seed crystal.

On the other hand, an alloy material in which Ti having a particle size not smaller than 100 μm and not greater than 150 μm is dispersed in a high-purity Fe—Co alloy, in which a content of Ni is not higher than 0.00001%, and which has a structure in which Ti has been precipitated, is prepared as a solvent for diamond synthesis. In addition, high-purity graphite in which an isotope has been enriched is prepared as a carbon source. In order to prevent introduction of a carbon isotope $^{13}C$ from ambience, a heater surface is coated with graphite having a concentration of the carbon isotope $^{12}C$ not lower than 99.9%.

Then, a diamond synthesis system in which a seed crystal, a solvent, and high-purity graphite as the carbon source, in which an isotope has been enriched, are arranged sequentially from below is enclosed with a cup-shaped cell made of carbon-free Fe, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of the carbon isotope $^{12}C$ was 99.9 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 140 GPa, which was found to be higher than 90 to 120 GPa which was hardness of conventional single-crystal diamond synthesized in similar steps except for a source material and a seed crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. Moreover, hardness thereof is approximately from 60 to 70 GPa at the highest. In contrast, the finding that, in single-crystal diamond in the present example, this threshold temperature was also higher than 250° C., in some single crystals, lowering in hardness was hardly observed even when a temperature exceeded 400° C., and hardness characteristics at a high temperature were also better than those of the conventional diamond, which was exemplified by the fact that hardness was also from 100 to 160 GPa by way of example, was obtained.

Example 2

Nitrogen is removed from a methane gas by passing the methane gas in which a concentration of a carbon isotope $^{12}C$ is 99.999% through sponge titanium heated to 600° C. or higher. This methane gas from which nitrogen has been removed is blown onto a Ta substrate heated to a high temperature of 1900° C. within a vacuum chamber. Thus, the methane gas is decomposed on the Ta substrate so that graphite having a size of 100 mm×100 mm, in which a concentration of the carbon isotope $^{12}C$ is not lower than 99.99% is formed on the Ta substrate. High-purity diamond is synthesized with the high-temperature and high-pressure synthesis method by using this graphite as a carbon source.

High-purity diamond in which an isotope has been enriched is observed with a polarizing microscope, a portion in a (100) plane extremely low in strain, having a size not smaller than 0.5 mm×0.5 mm, is cut from the single-crystal, and this portion is employed as a seed crystal.

On the other hand, an alloy material in which Ti having a particle size not smaller than 100 μm and not greater than 150 μm is dispersed in a high-purity Fe—Co alloy, in which a content of Ni is not higher than 0.00001%, and which has a structure in which Ti has been precipitated, is prepared as a solvent for diamond synthesis. In addition, high-purity graphite in which an isotope has been enriched is prepared as a carbon source. In order to prevent introduction of a carbon isotope $^{13}C$ from ambience, a heater surface is coated with graphite having a concentration of the carbon isotope $^{12}C$ not lower than 99.99%.

Then, a diamond synthesis system in which a seed crystal, a solvent, and high-purity graphite as the carbon source, in which an isotope has been enriched, are arranged sequentially from below is enclosed with a cup-shaped cell made of carbon-free Fe, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of the carbon isotope $^{12}C$ was 99.99 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 142 GPa, which was found to be higher than 90 to 120 GPa which was hardness of conventional single-crystal diamond synthesized in similar steps except for a source material and a seed crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, this threshold temperature was also higher than 260° C. and high-temperature characteristics were also better than those of the conventional diamond, was obtained.

Example 3

Nitrogen is removed from a methane gas by passing the methane gas in which a concentration of a carbon isotope $^{12}C$ is 99.999% through sponge titanium heated to 600° C. or higher. This methane gas from which nitrogen has been removed is blown onto a Ta substrate heated to a high temperature of 1900° C. within a vacuum chamber. Thus, the methane gas is decomposed on the Ta substrate so that graphite having a size of 100 mm×100 mm, in which a concentration of the carbon isotope $^{12}C$ is not lower than 99.999%, is formed on the Ta substrate. High-purity diamond is synthesized with the high-temperature and high-pressure synthesis method by using this graphite as a carbon source.

High-purity single-crystal diamond in which an isotope has been enriched is observed with a polarizing microscope, a portion in a (100) plane extremely low in strain, having a size not smaller than 0.5 mm×0.5 mm, is cut from the single-crystal, and this portion is employed as a seed crystal.

On the other hand, an alloy material in which Ti having a particle size not smaller than 100 μm and not greater than 150 μm is dispersed in a high-purity Fe—Co alloy, in which a content of Ni is not higher than 0.00001%, and which has a structure in which Ti has been precipitated, is prepared as a solvent for diamond synthesis. In addition, high-purity graphite in which an isotope has been enriched is prepared as a carbon source. In order to prevent introduction of a carbon isotope $^{13}C$ from ambience, a heater surface is coated with graphite having a concentration of the carbon isotope $^{12}C$ not lower than 99.999%.

Then, a diamond synthesis system in which a seed crystal, a solvent, and high-purity graphite as the carbon source, in which an isotope has been enriched, are arranged sequentially from below is enclosed with a cup-shaped cell made of carbon-free Fe, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of the carbon isotope $^{12}C$ was 99.99 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 143 GPa, which was found to be higher than 90 to 120 GPa which was hardness of conventional single-crystal diamond synthesized in similar steps except for a source material and a seed crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, this threshold temperature was also higher than 260° C. and high-temperature characteristics were also better than those of the conventional diamond, was obtained.

Example 4

Nitrogen is removed from a methane gas by passing the methane gas in which a concentration of a carbon isotope $^{12}C$ is 99.999% through sponge titanium heated to 600° C. or higher. This methane gas from which nitrogen has been removed is blown onto a Ta substrate heated to a high temperature of 1900° C. within a vacuum chamber. Thus, the methane gas is decomposed on the Ta substrate so that graphite having a size of 100 mm×100 mm, in which a concentration of the carbon isotope $^{12}C$ is not lower than 99.999%, is formed on the Ta substrate. High-purity diamond is synthesized with the high-temperature and high-pressure synthesis method by using this graphite as a carbon source.

Single-crystal diamond in which an isotope has been enriched to 99% or higher is observed with a polarizing microscope, a portion in a (100) plane extremely low in strain, having a size not smaller than 0.5 mm×0.5 mm, is cut from the single-crystal diamond in which the isotope has been enriched to 99% or higher, and this portion is employed as a seed crystal.

On the other hand, an alloy material in which Ti having a particle size not smaller than 100 μm and not greater than 150 μm is dispersed in a high-purity Fe—Co alloy, in which a content of Ni is not higher than 0.00001%, and which has a structure in which Ti has been precipitated, is prepared as a solvent for diamond synthesis. In addition, high-purity graphite in which an isotope has been enriched is prepared as a carbon source. In order to prevent introduction of a carbon isotope $^{13}C$ from ambience, a heater surface is coated with graphite having a concentration of the carbon isotope $^{12}C$ not lower than 99.999%.

Then, a diamond synthesis system in which a seed crystal, a solvent, and high-purity graphite as the carbon source, in which an isotope has been enriched, are arranged sequentially from below is enclosed with a cup-shaped cell made of carbon-free Fe, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of the carbon isotope $^{12}C$ was 99.999 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 160 GPa, which was found to be higher than 90 to 120 GPa which was hardness of conventional single-crystal diamond synthesized in similar steps except for a source material and a seed crystal and composed of a carbon isotope at a ratio as high as a natural abundance ratio.

Figure 2:
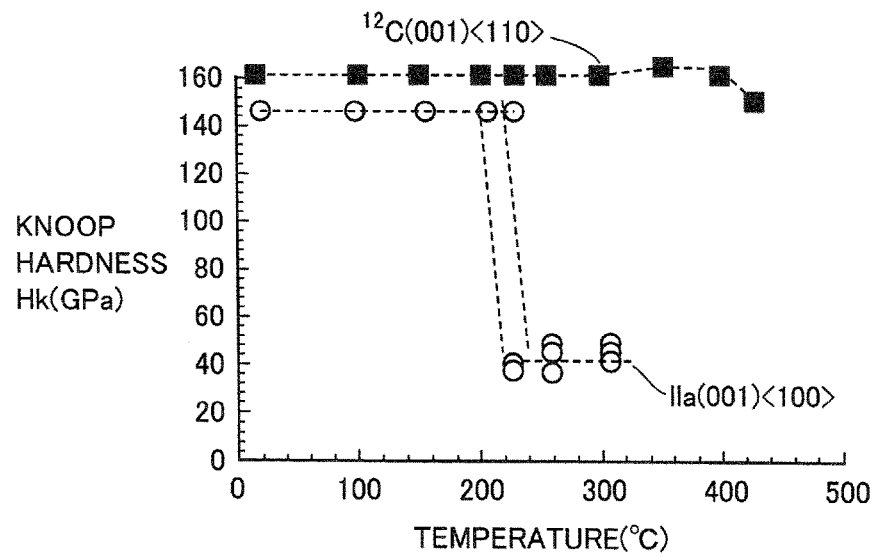
FIG. 2 is a diagram showing relation between Knoop hardness and a temperature.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, with regard to this threshold temperature as well, hardness until 400° C. was exceeded was approximately 160 GPa (see $^{12}C$ (001)<110> in FIG. 2) as shown in FIG. 2 and high-temperature characteristics were also better than those of the conventional diamond (see Ha (001)<100> in FIG. 2) $^{12}C$ is was obtained. In FIG. 2, "$^{12}C$" means that a concentration of the carbon isotope 99.9%, which belongs to the present invention. In addition, in FIG. 2, denotation as "Ha" indicates a diamond single crystal low in concentration of an impurity, and indicates those in which the carbon isotope $^{12}C$ is 98.9%±0.1%. As shown in FIG. 2, a ratio of Knoop hardness at 240° C. to Knoop hardness at room temperature in the <110> direction in the (001) plane of a single crystal is not lower than 0.95. This tendency is also similarly observed in a range from 240° C. to 400° C.

It is noted that an indenter fabricated with an ultra-high orientation of synthesized high-purity diamond was used as an indenter in measurement of hardness shown in FIG. 2. In addition, among those, an indenter capable of providing an indentation in the <110> direction in the (001) plane of diamond in the present example was selected as the indenter for measurement. Though no indentation was created in a sample indicated with Ha (001)<110> in FIG. 2 in past measurement, an indentation could be provided to various Ha diamonds by using a very hard indenter this time. Then, hardness of similar Ha crystals was measured and then hardness was approximately 140 GPa. Thus, a maximum value of Ha alone is shown in the figure as a reference value, although it is a point free from indentation based on literature data.

Diamond in each Example obtained as above has the following features. Namely, it is highly characterized in that a line width of a diamond P1 center in pulse-echo electron spin resonance (ESR) of diamond attributed to nitrogen introduced by a trace amount (a local concentration from 0 to 100 ppb) was equal to or less than 0.035 Gauss as a result of exclusion of an electron spin source N or a nuclear spin source $^{13}C$ in a crystal, and such a result can never be obtained in a conventional single crystal.

Example 5

Nitrogen is removed from a methane gas by passing the methane gas in which a concentration of a carbon isotope $^{12}C$ is 99.9% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.9%, was formed. Here, a pressure in the vacuum chamber was set approximately to $10^2$ to $10^4$ Pa. Since it has been known through experiments so far that hydrogen had been introduced in this diamond, diamond for a carbon source was subjected to heating treatment at 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, an alloy material in which Ti having a particle size not smaller than 100 μm and not greater than 150 μm is dispersed in a high-purity Fe—Co alloy, in which a content of Ni is not higher than 0.00001%, and which has a structure in which Ti has been precipitated, is prepared as a solvent for diamond synthesis. In addition, isotope-enriched graphite is prepared as a carbon source. In order to prevent introduction of a carbon isotope $^{13}C$ from ambience, a heater surface is coated with graphite having a concentration of the carbon isotope $^{12}C$ not lower than 99.9%.

Then, a diamond synthesis system in which a seed crystal, a solvent, and isotope-enriched graphite as the carbon source are arranged sequentially from below is enclosed with a cup-shaped cell made of carbon-free Fe, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of the carbon isotope $^{12}C$ was 99.9 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 140 GPa, which was found to be higher than 90 to 120 GPa which was hardness of conventional single-crystal diamond synthesized in similar steps except for a source material and a seed crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In addition, hardness thereof is approximately 60 to 70 GPa at the highest. In contrast, the finding that, in single-crystal diamond in the present example, this threshold temperature was also higher than 250° C., in some single crystals, lowering in hardness was hardly observed even when a temperature exceeded 450° C., and hardness characteristics at a high temperature were also better than those of the conventional diamond, which was exemplified by the fact that hardness was also from 100 to 160 GPa by way of example, was obtained.

Example 6

Nitrogen is removed from a methane gas by passing the methane gas in which a concentration of a carbon isotope $^{12}C$ is 99.99% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.99%, was formed. Here, a pressure in the vacuum chamber was set approximately to $10^2$ to $10^4$ Pa. Since it has been known through experiments so far that hydrogen had been introduced in this diamond, diamond for a carbon source was subjected to heating treatment at 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, an alloy material in which Ti having a particle size not smaller than 100 μm and not greater than 150 μm is dispersed in a high-purity Fe—Co alloy, in which a content of Ni is not higher than 0.00001%, and which has a structure in which Ti has been precipitated, is prepared as a solvent for diamond synthesis. In addition, high-purity graphite in which an isotope has been enriched is prepared as a carbon source. In order to prevent introduction of a carbon isotope $^{13}C$ from ambience, a heater surface is coated with graphite having a concentration of the carbon isotope $^{12}C$ not lower than 99.99%.

Then, a diamond synthesis system in which a seed crystal, a solvent, and high-purity graphite as the carbon source, in which an isotope has been enriched, are arranged sequentially from below is enclosed with a cup-shaped cell made of carbon-free Fe, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of the carbon isotope $^{12}C$ was 99.99 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 142 GPa, which was found to be higher than 90 to 120 GPa which was hardness of conventional single-crystal diamond which was a high-purity crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, this threshold temperature was also as high as 260° C. and high-temperature characteristics were also better than those of the conventional diamond, was obtained.

Example 7

Nitrogen is removed from a methane gas by passing the methane gas in which a concentration of a carbon isotope $^{12}C$ is 99.999% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.999%, was formed. Here, a pressure in the vacuum chamber was set approximately to $10^2$ to $10^4$ Pa. Since it has been known through experiments so far that hydrogen had been introduced in this diamond, diamond for a carbon source was subjected to heating treatment at 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, an alloy material in which Ti having a particle size not smaller than 100 μm and not greater than 150 μm is dispersed in a high-purity Fe—Co alloy, in which a content of Ni is not higher than 0.00001%, and which has a structure in which Ti has been precipitated, is prepared as a solvent for diamond synthesis. In addition, high-purity graphite in which an isotope has been enriched is prepared as a carbon source. In order to prevent introduction of a carbon isotope $^{13}C$ from ambience, a heater surface is coated with graphite having a concentration of the carbon isotope $^{12}C$ not lower than 99.999%.

Then, a diamond synthesis system in which a seed crystal, a solvent, and high-purity graphite as the carbon source, in which an isotope has been enriched, are arranged sequentially from below is enclosed with a cup-shaped cell made of carbon-free Fe, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of the carbon isotope $^{12}C$ was 99.99 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 143 GPa, which was found to be higher than 90 to 120 GPa which was hardness of conventional single-crystal diamond which was a high-purity crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, this threshold temperature was also as high as 260° C. and high-temperature characteristics were also better than those of the conventional diamond, was obtained.

Example 8

Nitrogen is removed from a methane gas by passing the methane gas in which a concentration of a carbon isotope $^{12}C$ is 99.999% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.995%, was formed. The reason why a degree of enrichment slightly lowered is considered to be because of introduction of air in a cell. Here, a pressure in the vacuum chamber was set approximately to $10^2$ to $10^4$ Pa. Since it has been known through experiments so far that hydrogen had been introduced in this diamond, diamond for a carbon source was subjected to heating treatment at 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, an alloy material in which Ti having a particle size not smaller than 100 μm and not greater than 150 μm is dispersed in a high-purity Fe—Co alloy, in which a content of Ni is not higher than 0.00001%, and which has a structure in which Ti has been precipitated, is prepared as a solvent for diamond synthesis. In addition, graphite in which an isotope has been enriched is prepared as a carbon source. In order to prevent introduction of a carbon isotope $^{13}C$ from ambience, a heater surface is coated with graphite having a concentration of the carbon isotope $^{12}C$ not lower than 99.999%.

Then, a diamond synthesis system in which a seed crystal, a solvent, and high-purity graphite as the carbon source, in which an isotope has been enriched, are arranged sequentially from below is enclosed with a cup-shaped cell made of carbon-free Fe, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of the carbon isotope $^{12}C$ was 99.999 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 145 GPa, which was found to be higher than 90 to 120 GPa which was hardness of conventional single-crystal diamond which was a high-purity crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, with regard to this threshold temperature as well, hardness until 400° C. was exceeded was 160 GPa or the like, and high-temperature characteristics were also better than those of the conventional diamond, was obtained.

Example 9

Nitrogen is removed from a methane gas by passing the methane gas in which a concentration of a carbon isotope $^{12}C$ is 99.9% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.9%, was formed. Here, a pressure in the vacuum chamber was set approximately to $10^2$ to $10^4$ Pa. Since it has been known through experiments so far that hydrogen had been introduced in this diamond, diamond for a carbon source was subjected to heating treatment at 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, an alloy material in which Ti having a particle size not smaller than 100 μm and not greater than 150 μm is dispersed in a high-purity Fe—Co alloy, in which a content of Ni is not higher than 0.00001%, and which has a structure in which Ti has been precipitated, is prepared as a solvent for diamond synthesis. In addition, isotope-enriched graphite is prepared as a carbon source. In order to prevent introduction of a carbon isotope $^{13}C$ from ambience, a heater surface was coated with diamond-like carbon having a concentration of the carbon isotope $^{12}C$ not lower than 99.9%.

Then, a diamond synthesis system in which a seed crystal, a solvent, and isotope-enriched graphite as the carbon source are arranged sequentially from below is enclosed with a cup-shaped cell made of carbon-free Fe, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of a carbon isotope $^{12}C$ was 99.9 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 140 GPa, which was found to be higher than 90 to 120 GPa which was hardness of conventional single-crystal diamond synthesized in similar steps except for a source material and a seed crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In addition, hardness thereof is approximately 60 to 70 GPa at the highest. In contrast, the finding that, in single-crystal diamond in the present example, this threshold temperature was also higher than 250° C., in some single crystals, lowering in hardness was hardly observed even when a temperature exceeded 450° C., and hardness characteristics at a high temperature were also better than those of the conventional diamond, which was exemplified by the fact that hardness was also from 100 to 160 GPa by way of example, was obtained.

Example 10

Nitrogen is removed from a methane gas by passing the methane gas in which a concentration of a carbon isotope $^{12}C$ is 99.99% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.99%, was formed. Here, a pressure in the vacuum chamber was set approximately to $10^2$ to $10^4$ Pa. Since it has been known through experiments so far that hydrogen had been introduced in this diamond, diamond for a carbon source was subjected to heating treatment at 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, an alloy material in which Ti having a particle size not smaller than 100 μm and not greater than 150 μm is dispersed in a high-purity Fe—Co alloy, in which a content of Ni is not higher than 0.00001%, and which has a structure in which Ti has been precipitated, is prepared as a solvent for diamond synthesis. In addition, high-purity graphite in which an isotope has been enriched is prepared as a carbon source. In order to prevent introduction of a carbon isotope $^{13}C$ from ambience, a heater surface was coated with diamond-like carbon having a concentration of the carbon isotope $^{12}C$ not lower than 99.99%.

Then, a diamond synthesis system in which a seed crystal, a solvent, and high-purity graphite as the carbon source, in which an isotope has been enriched, are arranged sequentially from below is enclosed with a cup-shaped cell made of carbon-free Fe, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of a carbon isotope $^{12}C$ was 99.99 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 142 GPa, which was found to be higher than 90 to 120 GPa which was hardness of conventional single-crystal diamond which was a high-purity crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, this threshold temperature was also as high as 260° C. and high-temperature characteristics were also better than those of the conventional diamond, was obtained.

Example 11

Nitrogen is removed from a methane gas by passing the methane gas in which a concentration of a carbon isotope $^{12}C$ is 99.999% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.999%, was formed. Here, a pressure in the vacuum chamber was set approximately to $10^2$ to $10^4$ Pa. Since it has been known through experiments so far that hydrogen had been introduced in this diamond, diamond for a carbon source was subjected to heating treatment at 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, an alloy material in which Ti having a particle size not smaller than 100 μm and not greater than 150 μm is dispersed in a high-purity Fe—Co alloy, in which a content of Ni is not higher than 0.00001%, and which has a structure in which Ti has been precipitated, is prepared as a solvent for diamond synthesis. In addition, high-purity graphite in which an isotope has been enriched is prepared as a carbon source. In order to prevent introduction of a carbon isotope $^{13}C$ from ambience, a heater surface was coated with diamond-like carbon having a concentration of the carbon isotope $^{12}C$ not lower than 99.999%.

Then, a diamond synthesis system in which a seed crystal, a solvent, and high-purity graphite as the carbon source, in which an isotope has been enriched, are arranged sequentially from below is enclosed with a cup-shaped cell made of carbon-free Fe, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of a carbon isotope $^{12}C$ was 99.99 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 143 GPa, which was found to be higher than 90 to 120 GPa which was hardness of conventional single-crystal diamond which was a high-purity crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, this threshold temperature was also as high as 260° C. and high-temperature characteristics were also better than those of the conventional diamond, was obtained.

Example 12

Nitrogen is removed from a methane gas by passing the methane gas in which a concentration of a carbon isotope $^{12}C$ is 99.999% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.995%, was formed. The reason why a degree of enrichment slightly lowered is considered to be because of introduction of air in a cell. Here, a pressure in the vacuum chamber was set approximately to $10^2$ to $10^4$ Pa. Since it has been known through experiments so far that hydrogen had been introduced in this diamond, diamond for a carbon source was subjected to heating treatment at 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, an alloy material in which Ti having a particle size not smaller than 100 μm and not greater than 150 μm is dispersed in a high-purity Fe—Co alloy, in which a content of Ni is not higher than 0.00001%, and which has a structure in which Ti has been precipitated, is prepared as a solvent for diamond synthesis. In addition, graphite in which an isotope has been enriched is prepared as a carbon source. In order to prevent introduction of a carbon isotope $^{13}C$ from ambience, a heater surface was coated with diamond-like carbon having a concentration of the carbon isotope $^{12}C$ not lower than 99.999%.

Then, a diamond synthesis system in which a seed crystal, a solvent, and high-purity graphite as the carbon source, in which an isotope has been enriched, are arranged sequentially from below is enclosed with a cup-shaped cell made of carbon-free Fe, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of a carbon isotope $^{12}C$ was 99.999 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 145 GPa, which was found to be higher than 90 to 120 GPa which was hardness of conventional single-crystal diamond which was a high-purity crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, with regard to this threshold temperature as well, hardness until 400° C. was exceeded was 160 GPa or the like, and high-temperature characteristics were also better than those of the conventional diamond, was obtained.

Comparative Example

A methane gas in which a concentration of a carbon isotope $^{12}C$ was 99.999% was used to synthesize single-crystal diamond with the CVD method. In this single-crystal diamond, substantially no impurity such as nitrogen, boron, and nickel was introduced, but hydrogen approximately by 0.01 mass % or more was present. Hardness of the single-crystal diamond in the present Comparative Example was approximately from 90 GPa to 100 GPa and it was found that single-crystal diamond obtained through high-temperature and high-pressure synthesis in the present Example had higher hardness.

Another embodiment of the present invention will be described hereinafter with reference to FIG. 3.

Though single-crystal diamond in the present embodiment is composed of carbon in which a concentration of a carbon isotope $^{12}C$ is not lower than 99.9 mass % and a plurality of inevitable impurities other than carbon like single-crystal diamond in one embodiment of the present invention described above, it is different from single-crystal diamond in one embodiment of the present invention described above in that no Ni is contained as an impurity.

As a result of studies conducted by the inventors of the present application, it has also been found that hardness of single-crystal diamond can be increased by increasing a concentration of a carbon isotope $^{12}C$ in diamond and lowering a concentration of an inevitable impurity to below a prescribed level and that hardness characteristics at a high temperature can further be enhanced by adjusting an impurity not to contain Ni. It has also been found that a spectral line width of single-crystal diamond according to the present embodiment in pulse-echo electron spin resonance (ESR) is sharpened, that is, strain is extremely low. Since strain is low, application to an analyzing crystal or a substrate for a power device can be expected. In addition, since a degree of enrichment of $^{12}C$ is high and a concentration of an impurity is extremely low, a nuclear spin of $^{13}C$ or a spin derived from nitrogen and Ni is absent, which means spin-less. Therefore, development as a base for a substrate for a quantum computer can be expected.

The inevitable impurity can typically be exemplified by nitrogen, boron, hydrogen, and the like, and a total content of these inevitable impurities is set to 0.01 mass % or lower. For example, a total content of nitrogen, boron, and hydrogen of a plurality of inevitable impurities above is set to 0.01 mass % or lower. Namely, a concentration of an impurity in diamond is approximately not higher than a detection limit in SIMS (Secondary Ion Mass Spectrometry) analysis. A concentration of a transition metal in diamond is approximately not higher than a detection limit in ICP (Inductively Coupled Plasma) analysis or SIMS analysis. In the present embodiment, in particular, a content of nitrogen, boron, and the like is preferably significantly lowered. In addition, Ni is not included in the inevitable impurity above, and the single-crystal diamond according to the present embodiment does not contain Ni as an impurity. Here, "not containing Ni" herein means not higher than the detection limit in ICP analysis or SIMS analysis.

By increasing a concentration of a carbon isotope $^{12}C$ (purity of a carbon isotope) in diamond and setting a content of an inevitable impurity to an unprecedented low level as above, non-uniformity in a diamond crystal can be extremely low and bond between crystal lattices can be stronger. Namely, though a bond length or a mass is different between a carbon isotope $^{12}C$ and a carbon isotope $^{13}C$, non-uniformity in bond length caused thereby is substantially eliminated, so that there will be extremely few starting points of breakage of interatomic bond against external force. Consequently, single-crystal diamond higher in hardness by at least 5% than conventional single-crystal diamond containing a carbon isotope $^{13}C$ around 1.1% (a natural abundance ratio) could be synthesized.

In single-crystal diamond in the present embodiment, for example, a concentration of nitrogen is not lower than 0.000001 mass % (0.01 ppm) and not higher than 0.0001 mass % (1 ppm), a concentration of boron is not higher than 0.0001 mass % (1 ppm), a concentration of hydrogen is lower than 0.01 mass %, and Ni is not contained.

As above, preferably, a content of nitrogen and boron in diamond is lower than a content of hydrogen. In the present embodiment, a content of nitrogen and boron in diamond is approximately not higher than 1/100 of a content of hydrogen.

As above, by increasing a concentration of a carbon isotope $^{12}C$ in diamond and lowering a concentration of an inevitable impurity, hardness of single-crystal diamond in the present embodiment can be as high as 130 GPa or higher. This value can be concluded as a value dominantly higher than hardness of general high-purity diamond (approximately from 100 to 120 GPa).

With regard to Knoop hardness in a <110> direction in a (001) plane of diamond, single-crystal diamond composed of a carbon isotope at a ratio as high as a natural abundance ratio and synthesized in a step similar to that in a manufacturing method according to the present embodiment except for a source material and a seed crystal as well as a material such as a base material not containing Ni and a solvent has a threshold value in a range from 200 to 230° C. as shown in NPD 1 and indentation appears.

In contrast, in single-crystal diamond in the present embodiment, no indentation is produced even at 250° C. and high-temperature hardness characteristics are also excellent. It is noted that a temperature not lower than a room temperature is regarded as a high temperature herein, and specifically even a temperature around 30° C. or higher is also referred to as a high temperature. Surprisingly, the single-crystal diamond in the present embodiment has a threshold temperature described above not lower than approximately 400° C. and lowering in Knoop hardness was hardly observed at least up to 450° C., up to which we could conduct measurement. Here, a temperature of 450° C. is mentioned because, at a temperature equal to or higher than 450° C., an indenter, that is, a synthesized Ha single crystal, could no longer be 65 conducted. Namely, the finding that single-crystal diamond in the present embodiment was better also in hardness characteristics at a high temperature than single-crystal diamond present so far was obtained.

A method of manufacturing single-crystal diamond in the present embodiment will now be described with reference to FIG. 3. In order to fabricate single-crystal diamond in the present embodiment, a hydrocarbon gas in which a concentration of a carbon isotope $^{12}C$ is not lower than 99.9 mass % is prepared. For example, a methane gas can be employed as the hydrocarbon gas.

Figure 3:
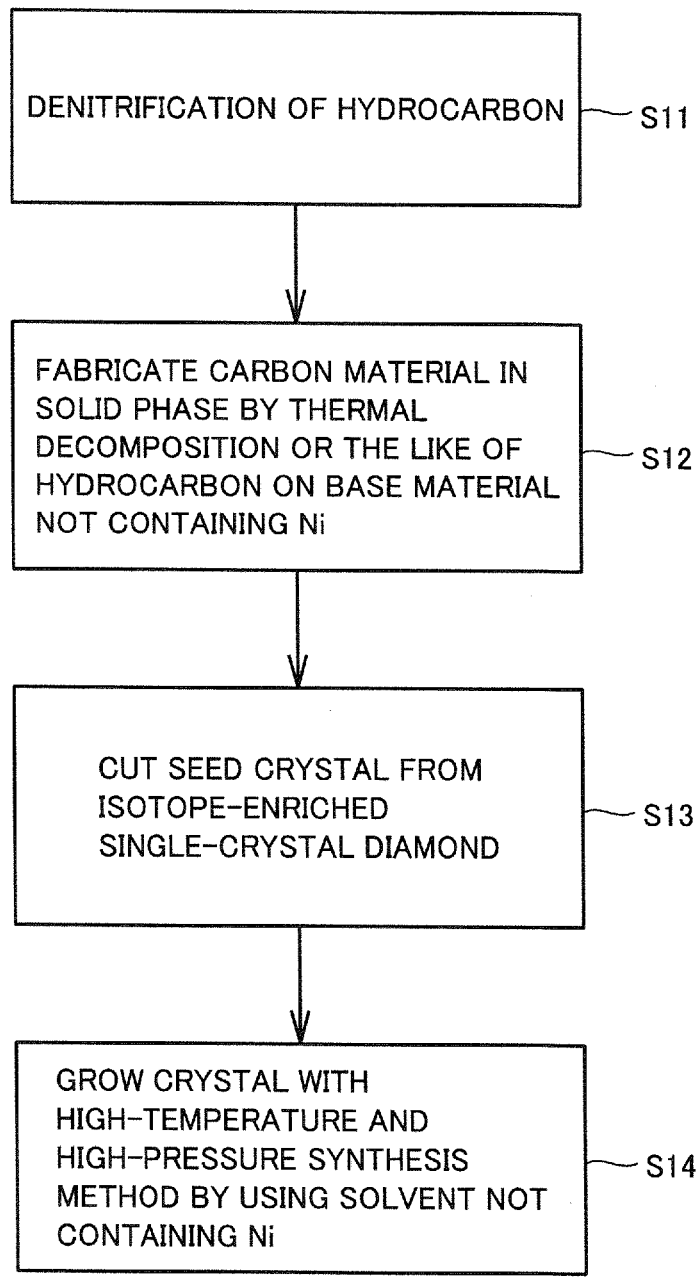
FIG. 3 is a diagram showing a flow of manufacturing single-crystal diamond in another embodiment of the present invention.

Then, as shown in FIG. 3, the hydrocarbon gas is subjected to denitrification (step S11). Then, the hydrocarbon gas subjected to denitrification is introduced in a vacuum chamber, and in a vacuum atmosphere or in an inert gas atmosphere, vapor-phase synthesized diamond is synthesized at a temperature approximately not lower than 600° C. and not higher than 1300° C. or the hydrocarbon gas is thermally decomposed on a base material not containing Ni at a temperature not lower than 1200° C. and not higher than 2300° C. For example, as shown in FIG. 3, graphite in a solid phase (solid carbon) can be fabricated on a base material (step S12). A concentration of a carbon isotope $^{12}C$ in graphite is not lower than 99.9 mass %. It is noted that a degree of vacuum within the vacuum chamber during generation of graphite is desirably set, for example, approximately to 20 to 100 Torr. In addition, an amount of an impurity other than carbon may be not higher than 0.01 mass % by annealing vapor-phase synthesized diamond at a temperature not lower than 1800° C.

Thus, since diamond is vapor-phase synthesized from the hydrocarbon gas in a vapor-phase state in the vacuum chamber set to a vacuum atmosphere or an inert gas atmosphere or a carbon material in a solid phase is fabricated on a base material through thermal decomposition, an amount of an impurity contained in the carbon material can extremely be reduced as described above.

In thermal decomposition of the hydrocarbon gas, the hydrocarbon gas is preferably fed toward the base material. The hydrocarbon gas may be supplied to the base material from above or may be supplied toward the base material in a diagonal direction or a lateral direction.

For the base material, for example, Ta, W, Re, or carbide thereof can be employed. Here, a base material not containing Ni is selected. In addition, a material obtained by peeling off from the base material, a carbon material such as graphite formed on this base material can also be employed as a base material. In this case, a carbon material small in an amount of an impurity can be employed as a base material, and introduction of an impurity into a carbon material such as graphite formed thereon can further effectively be suppressed.

In forming a carbon material such as graphite on a base material, for example, the base material set in the vacuum chamber is desirably heated to a temperature not lower than 1200° C. The base material is heated preferably approximately to 1500° C. to 2000° C. and more preferably approximately to 1900° C. to 2000° C. A well known technique can be adopted as a heating method. For example, it is possible that a heater capable of directly or indirectly heating the base material to a temperature not lower than 1200° C. is provided in the vacuum chamber. It is noted that such a condition as a temperature or a pressure should appropriately be adjusted in order to form a portion to serve as a seed crystal which will be described later in a carbon material.

Preferably, density of the carbon material such as graphite described above is not lower than 1.4 g/cm³. Thus, even though volume change due to compression during high-temperature and high-pressure synthesis occurs, deformation of a heater due to abnormal deformation of a cell or interference or failure in crystal growth due to change in resistance caused thereby can be suppressed.

Then, single-crystal diamond in which an isotope is enriched with a high-temperature and high-pressure synthesis method (for example, not lower than 5 GPa and not lower than 1300° C.) is synthesized by using a carbon material such as graphite described above as a carbon source. As shown in FIG. 3, for example, laser is used to cut a seed crystal from high-purity single-crystal diamond in which an isotope has been enriched (step S3). Single-crystal diamond is, for example, in a flat plate shape and includes a single-crystal portion having low strain. A size of a single crystal is preferably greater than 0.5 mm×0.5 mm. A seed crystal of low strain is cut from this single-crystal diamond. More specifically, a single-crystal portion including a (100) plane is cut from single-crystal diamond.

Here, preferably, a portion in the (100) plane extremely low in strain is selected and cut after checking with a polarizing microscope, and this portion is used as a seed crystal.

In a portion relatively high in strain, not only a concentration of a carbon isotope $^{12}C$ is low but also aggregation or the like of an impurity such as nitrogen occurs. In addition, strain in a seed crystal is reflected during growth of a diamond crystal and a newly grown crystal also has strain, and thus an impurity also tends to be introduced in the diamond crystal. Thus, when a portion relatively high in strain is cut and employed, non-uniformity of a diamond crystal is high and consequently hardness of diamond is lowered.

While the seed crystal above is accommodated in a cell together with a solvent and a carbon source, single-crystal diamond is grown from the seed crystal with the high-temperature and high-pressure synthesis method (for example, not lower than 5 GPa and not lower than 1300° C.) as shown in FIG. 3 (step S14).

The solvent can be composed, for example, of carbon-free Fe. For example, graphite in which an isotope has been enriched can be used as the carbon source.

In synthesizing single-crystal diamond, a diamond synthesis system in which a seed crystal, a solvent, and the carbon source are arranged sequentially from below is accommodated in a cell. As a material for a cell, for example, a material not containing carbon and Ni but containing Fe can be exemplified, and a cup-shaped cell can be employed. An upper surface of this cell is sealed in vacuum not higher than $10^{-3}$ Pa. Thus, introduction of a carbon isotope $^{13}C$ and nitrogen in atmosphere into the cell can be suppressed and the inside of the cell can be set substantially to a vacuum state. Thus, introduction of an impurity gas such as CO, $CO_2$, $NO_N$, and $H_2O$ included in atmosphere can be suppressed.

Before the method as above is adopted, even with the use of a carbon source in which a concentration of a carbon isotope $^{12}C$ is 99.999%, there has been even a case that a concentration of a carbon isotope $^{12}C$ in obtained diamond crystal lowers approximately to 99%. In the present embodiment, however, with vacuum sealing as above, a concentration of a carbon isotope $^{12}C$ in an obtained diamond crystal can be not lower than 99.9%. In addition, nitrogen can also be suppressed to a ppb order.

A surface of a heater used in the high-temperature and high-pressure synthesis method above is preferably coated with thermally decomposed carbon, graphite, diamond-like carbon, or vapor-phase synthesized diamond, in which a concentration of a carbon isotope $^{12}C$ is not lower than 99.9 mass % and an impurity other than carbon is not higher than 0.01 mass %. Thus, introduction of a carbon isotope $^{13}C$ from ambience into a diamond crystal can be suppressed.

For example, natural graphite can be used for a heater. Since this heater contains carbon by 1.1% or higher, introduction of carbon in the heater into diamond is a serious issue in achieving a higher concentration of a carbon isotope $^{12}C$.

Then, adoption of the following three techniques is considered. Initially, a first technique is a technique for forming a graphite layer on a surface of a heater by heating a surface of the heater in advance and blowing thereto a methane gas in which a carbon isotope $^{12}C$ has been enriched.

A second technique is a method of coating a surface of a heater with a sputtering method, with graphite fabricated with a carbon isotope $^{12}C$ obtained from a methane gas in which a carbon isotope $^{12}C$ has been enriched serving as a sputtering target.

A third technique is similar to a method of coating a sample with graphite during observation with an SEM (Scanning Electron Microscope) or the like. Namely, it is a method of coating a heater with graphite in which a carbon isotope $^{12}C$ has been enriched by employing graphite fabricated with a carbon isotope $^{12}C$ obtained from a methane gas in which a carbon isotope $^{12}C$ has been enriched as an electrode and causing discharge between the electrodes.

Limitation to the three methods above, however, is not intended, and an effect is obtained in any of a case that the heater is coated with graphite with any method, a case that the entire heater is fabricated with graphite in which an isotope has been enriched, and a case that the heater is fabricated with solid carbon such as diamond-like carbon or diamond.

It is noted that single-crystal diamond in the present embodiment should only be grown from a seed crystal, for example, at 5 GPa or higher and at a temperature not lower than 1350° C.

Diamond thus obtained has the following features in addition to high hardness. Namely, a half-width of a pulse-echo electron spin resonance line of diamond attributed to nitrogen introduced by a trace amount (a local concentration from 0 to 100 ppb) is equal to or lower than 0.035 Gauss as a result of exclusion of an electron spin source N or a nuclear spin source $^{13}C$ in a crystal. Such a result can never be obtained in a conventional single crystal.

This can be achieved only by the following factors. Namely, the single-crystal diamond in the present embodiment has defect density not higher than $10/cm^2$, and it is within ±1% as a result of confirmation of stress distribution in a plane with Raman spectroscopy. In addition, a portion free from a shaded portion indicating a defective site can be extracted from an image taken in X-ray topography, and it was found that a crystal very low in strain and highly crystalline could be provided. In addition, hardness was approximately 10% higher than hardness of those fabricated from natural carbon, and no degradation in strength due to plastic deformation in a (001)<110> direction as seen in a common IIa single crystal at a high temperature was not observed. An example of single-crystal diamond and a method of manufacturing the same relating to another embodiment of the present invention will now be described.

Example 13

Nitrogen is removed from a methane gas by passing the methane gas in which a concentration of a carbon isotope $^{12}C$ is 99.9% through sponge titanium heated to 600° C. or higher. This methane gas from which nitrogen has been removed is blown onto a Ta substrate heated to a high temperature of 1900° C. and not containing Ni within a vacuum chamber. Thus, the methane gas is decomposed on the Ta substrate so that graphite having a size of 10 mm×10 mm, in which a concentration of the carbon isotope $^{12}$C is not lower than 99.9%, is formed on the Ta substrate. Here, a pressure in the vacuum chamber is set approximately to $10^2$ to $10^4$ Pa. High-purity diamond is synthesized with the high-temperature and high-pressure synthesis method by using this graphite as a carbon source.

High-purity diamond in which an isotope has been enriched is observed with a polarizing microscope, a portion in a (100) plane extremely low in strain, having a size not smaller than 0.5 mm×0.5 mm, is cut, and this portion is employed as a seed crystal.

On the other hand, a high-purity Fe—Co—Ti alloy not containing Ni is prepared as a solvent for diamond synthesis. In addition, high-purity graphite in which an isotope has been enriched is prepared as a carbon source. In order to prevent introduction of a carbon isotope $^{13}$C from ambience, a heater surface is coated with graphite having a concentration of the carbon isotope not lower than 99.9%.

Then, a diamond synthesis system in which a seed crystal, a solvent, and high-purity graphite as the carbon source, in which an isotope has been enriched, are arranged sequentially from below is enclosed with a cup-shaped cell made of Fe and not containing carbon and Ni, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond not containing Ni, in which a concentration of a carbon isotope $^{12}$C was 99.9 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 140 GPa, which was found to be higher than 90 to 120 GPa which was hardness of conventional single-crystal diamond synthesized in similar steps except for a source material and a seed crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In addition, hardness thereof is approximately 60 to 70 GPa at the highest. In contrast, in single-crystal diamond in the present example, this threshold temperature was also higher than 250° C., in some single crystals, lowering in hardness was hardly observed even when a temperature exceeded 450° C., and plastic deformation did not occur up to 600° C. at which diamond burns in atmosphere. The finding that hardness characteristics at a high temperature were also better than those of the conventional diamond was obtained.

Example 14

Nitrogen is removed from a methane gas by passing the methane gas in which a concentration of a carbon isotope $^{12}$C is 99.999% through sponge titanium heated to 600° C. or higher. This methane gas from which nitrogen has been removed is blown onto a Ta substrate heated to a high temperature of 1900° C. and not containing Ni within a vacuum chamber. Thus, the methane gas is decomposed on the Ta substrate so that graphite having a size of 100 mm×100 mm, in which a concentration of the carbon isotope $^{12}$C is not lower than 99.99%, is formed on the Ta substrate. High-purity diamond is synthesized with the high-temperature and high-pressure synthesis method by using this graphite as a carbon source.

High-purity diamond in which an isotope has been enriched is observed with a polarizing microscope, a portion in a (100) plane extremely low in strain, having a size not smaller than 0.5 mm×0.5 mm, is cut from the single crystal, and this portion is employed as a seed crystal.

On the other hand, a high-purity Fe—Co—Ti alloy not containing Ni is prepared as a solvent for diamond synthesis. In addition, high-purity graphite in which an isotope has been enriched is prepared as a carbon source. In order to prevent introduction of a carbon isotope $^{13}$C from ambience, a heater surface is coated with graphite having a concentration of the carbon isotope $^{12}$C not lower than 99.99%.

Then, a diamond synthesis system in which a seed crystal, a solvent, and high-purity graphite as the carbon source, in which an isotope has been enriched, are arranged sequentially from below is enclosed with a cup-shaped cell made of Fe and not containing carbon and Ni, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond not containing Ni, in which a concentration of a carbon isotope $^{12}$C was 99.99 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 145 GPa, which was found to be higher than 90 to 120 GPa which was hardness of conventional single-crystal diamond synthesized in similar steps except for a source material and a seed crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, this threshold temperature was also higher than 300° C. and high-temperature characteristics were also better than those of the conventional diamond, was obtained.

Example 15

Nitrogen is removed from a methane gas by passing the methane gas in which a concentration of a carbon isotope $^{12}$C is 99.999% through sponge titanium heated to 600° C. or higher. This methane gas from which nitrogen has been removed is blown onto a Ta substrate heated to a high temperature of 1900° C. and not containing Ni within a vacuum chamber. Thus, the methane gas is decomposed on the Ta substrate so that graphite having a size of 100 mm×100 mm, in which a concentration of a carbon isotope $^{12}$C is not lower than 99.999%, is formed on the Ta substrate. High-purity diamond is synthesized with the high-temperature and high-pressure synthesis method by using this graphite as a carbon source.

High-purity single-crystal diamond in which an isotope has been enriched is observed with a polarizing microscope, and a portion in a (100) plane extremely low in strain, having a size not smaller than 0.5 mm×0.5 mm, is cut from the single crystal, and this portion is employed as a seed crystal.

On the other hand, a high-purity Fe—Co—Ti alloy not containing Ni is prepared as a solvent for diamond synthesis. In addition, high-purity graphite in which an isotope has been enriched is prepared as a carbon source. In order to prevent introduction of a carbon isotope $^{13}C$ from ambience, a heater surface is coated with graphite having a concentration of the carbon isotope $^{12}C$ not lower than 99.999%.

Then, a diamond synthesis system in which a seed crystal, a solvent, and high-purity graphite as the carbon source, in which an isotope has been enriched, are arranged sequentially from below is enclosed with a cup-shaped cell made of Fe and not containing carbon and Ni, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond not containing Ni, in which a concentration of a carbon isotope $^{12}C$ was 99.99 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 143 GPa, which was found to be higher than 90 to 120 GPa which was hardness of conventional single-crystal diamond synthesized in similar steps except for a source material and a seed crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, this threshold temperature was also higher than 300° C. and high-temperature characteristics were also better than those of the conventional diamond, was obtained.

Example 16

Nitrogen is removed from a methane gas by passing the methane gas in which a concentration of a carbon isotope $^{12}C$ is 99.999% through sponge titanium heated to 600° C. or higher. This methane gas from which nitrogen has been removed is blown onto a Ta substrate heated to a high temperature of 1900° C. and not containing Ni within a vacuum chamber. Thus, the methane gas is decomposed on the Ta substrate so that graphite having a size of 100 mm×100 mm, in which a concentration of the carbon isotope $^{12}C$ is not lower than 99.999%, is formed on the Ta substrate. High-purity diamond is synthesized with the high-temperature and high-pressure synthesis method by using this graphite as a carbon source.

Single-crystal diamond in which an isotope has been enriched to 99% or higher is observed with a polarizing microscope, a portion in a (100) plane extremely low in strain, having a size not smaller than 0.5 mm×0.5 mm, is cut from single-crystal diamond in which the isotope has been enriched to 99% or higher, and this portion is employed as a seed crystal.

On the other hand, a high-purity Fe—Co—Ti alloy not containing Ni is prepared as a solvent for diamond synthesis. In addition, high-purity graphite in which an isotope has been enriched is prepared as a carbon source. In order to prevent introduction of a carbon isotope $^{13}C$ from ambience, a heater surface is coated with graphite having a concentration of the carbon isotope $^{12}C$ not lower than 99.999%.

Then, a diamond synthesis system in which a seed crystal, a solvent, and high-purity graphite as the carbon source, in which an isotope has been enriched, are arranged sequentially from below is enclosed with a cup-shaped cell made of Fe and not containing carbon and Ni, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond not containing Ni, in which a concentration of a carbon isotope $^{12}C$ was 99.999 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 145 GPa, which was found to be higher than 90 to 120 GPa which was hardness of conventional single-crystal diamond synthesized in similar steps except for a source material and a seed crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, with regard to this threshold temperature as well, hardness until 400° C. was exceeded was approximately 160 GPa, and high-temperature characteristics were also better than those of the conventional diamond, was obtained.

Diamond in each example obtained as above has the following features. Namely, it is highly characterized in that a line width of a diamond P1 center in ESR of diamond attributed to nitrogen introduced by a trace amount (a local concentration from 0 to 100 ppb) was equal to or lower than 0.020 Gauss as a result of exclusion of an electron spin source N or a nuclear spin source $^{13}C$ in a crystal, and such a result can never be obtained in a conventional isotope-enriched single crystal even as compared with NPD 1. Defect density was 0/cm$^2$ in a measurement area of 5-mm square. In addition, no strain was observed in analysis with X-ray topography. In analysis with Raman spectroscopy, distribution of Raman shift was within ±0.1 cm$^{-1}$ in a plane, and hence it could be confirmed that there was no distribution of strain.

Example 17

Nitrogen is removed from a methane gas by passing the methane gas in which a concentration of a carbon isotope $^{12}C$ is 99.9% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.9%, was formed. Here, a pressure in the vacuum chamber was set approximately to 10$^2$ to 10$^4$ Pa. Since it has been known through experiments so far that hydrogen had been introduced in this diamond, diamond for a carbon source was subjected to heating treatment from 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, a high-purity Fe—Co—Ti alloy not containing Ni is prepared as a solvent for diamond synthesis. In addition, isotope-enriched graphite is prepared as a carbon source. In order to prevent introduction of a carbon isotope $^{13}C$ from ambience, a heater surface is coated with graphite having a concentration of the carbon isotope $^{12}C$ not lower than 99.9%.

Then, a diamond synthesis system in which a seed crystal, a solvent, and isotope-enriched graphite as the carbon source are arranged sequentially from below is enclosed with a cup-shaped cell made of Fe and not containing carbon and Ni, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of a carbon isotope $^{12}C$ was 99.9 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 140 GPa, which was found to be higher than 90 to 120 GPa which was hardness of conventional single-crystal diamond synthesized in similar steps except for a source material and a seed crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In addition, hardness thereof is approximately 60 to 70 GPa at the highest. In contrast, in single-crystal diamond in the present example, this threshold temperature was also higher than 250° C., in some single crystals, lowering in hardness was not observed even when a temperature exceeded 450° C., and plastic deformation was not observed from a combustion temperature of diamond in atmosphere up to 600° C. which was a measurement limit. Thus, the finding that hardness characteristics at a high temperature were also better than those of the conventional diamond was obtained.

Example 18

Nitrogen is removed from a methane gas by passing the methane gas in which a concentration of a carbon isotope $^{12}C$ is 99.99% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.99%, was formed. Here, a pressure in the vacuum chamber was set approximately to $10^2$ to $10^4$ Pa. Since it has been known through experiments so far that hydrogen had been introduced in this diamond, diamond for a carbon source was subjected to heating treatment from 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, a high-purity Fe—Co—Ti alloy not containing Ni is prepared as a solvent for diamond synthesis. In addition, high-purity graphite in which an isotope has been enriched is prepared as a carbon source. In order to prevent introduction of a carbon isotope $^{13}C$ from ambience, a heater surface is coated with graphite having a concentration of the carbon isotope $^{12}C$ not lower than 99.99%.

Then, a diamond synthesis system in which a seed crystal, a solvent, and high-purity graphite as the carbon source, in which an isotope has been enriched, are arranged sequentially from below is enclosed with a cup-shaped cell made of Fe and not containing carbon and Ni, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of a carbon isotope $^{12}C$ was 99.99 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 142 GPa, which was found to be higher than 90 to 120 GPa which was hardness of conventional single-crystal diamond which was a high-purity crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, this threshold temperature was also as high as 300° C. and high-temperature characteristics were also better than those of the conventional diamond, was obtained.

Example 19

Nitrogen is removed from a methane gas by passing the methane gas in which a concentration of a carbon isotope $^{12}C$ is 99.999% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.999%, was formed. Here, a pressure in the vacuum chamber was set approximately to $10^2$ to $10^4$ Pa. Since it has been known through experiments so far that hydrogen had been introduced in this diamond, diamond for a carbon source was subjected to heating treatment from 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, a high-purity Fe—Co—Ti alloy not containing Ni is prepared as a solvent for diamond synthesis. In addition, high-purity graphite in which an isotope has been enriched is prepared as a carbon source. In order to prevent introduction of a carbon isotope $^{13}$C from ambience, a heater surface is coated with graphite having a concentration of the carbon isotope $^{12}$C not lower than 99.999%.

Then, a diamond synthesis system in which a seed crystal, a solvent, and high-purity graphite as the carbon source, in which an isotope has been enriched, are arranged sequentially from below is enclosed with a cup-shaped cell made of Fe and not containing carbon and Ni, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of a carbon isotope $^{12}$C was 99.99 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 143 GPa, which was found to be higher than 90 to 120 GPa which was hardness of conventional single-crystal diamond which was a high-purity crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, this threshold temperature was also as high as 300° C. and high-temperature characteristics were also better than those of the conventional diamond, was obtained.

Example 20

Nitrogen is removed from a methane gas by passing the methane gas in which a concentration of a carbon isotope $^{12}$C is 99.999% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}$C was not lower than 99.995%, was formed. The reason why a degree of enrichment slightly lowered is considered to be because of introduction of air in a cell. Here, a pressure in the vacuum chamber was set approximately to $10^2$ to $10^4$ Pa. Since it has been known through experiments so far that hydrogen had been introduced in this diamond, diamond for a carbon source was subjected to heating treatment from 1800° C. to 2000° C. and obtained solid was employed as a carbon-isotope-$^{12}$C-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, a high-purity Fe—Co—Ti alloy not containing Ni is prepared as a solvent for diamond synthesis. In addition, graphite in which an isotope has been enriched is prepared as a carbon source. In order to prevent introduction of a carbon isotope $^{13}$C from ambience, a heater surface is coated with graphite having a concentration of the carbon isotope $^{12}$C not lower than 99.999%.

Then, a diamond synthesis system in which a seed crystal, a solvent, and high-purity graphite as the carbon source, in which an isotope has been enriched, are arranged sequentially from below is enclosed with a cup-shaped cell made of Fe and not containing carbon and Ni, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of a carbon isotope $^{12}$C was 99.999 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 145 GPa, which was found to be higher than 90 to 120 GPa which was hardness of conventional single-crystal diamond which was a high-purity crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, with regard to this threshold temperature as well, hardness until 400° C. was exceeded was 160 GPa or the like, and high-temperature characteristics were also better than those of the conventional diamond, was obtained.

Example 21

Nitrogen is removed from a methane gas by passing the methane gas in which a concentration of a carbon isotope $^{12}$C is 99.9% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}$C was not lower than 99.9%, was formed. Here, a pressure in the vacuum chamber is set approximately to $10^2$ to $10^4$ Pa. Since it has been known through experiments so far that hydrogen had been introduced in this diamond, diamond for a carbon source was subjected to heating treatment from 1800° C. to 2000° C. and obtained solid was employed as a carbon-isotope-$^{12}$C-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, a high-purity Fe—Co—Ti alloy not containing Ni is prepared as a solvent for diamond synthesis. In addition, isotope-enriched graphite is prepared as a carbon source. In order to prevent introduction of a carbon isotope $^{13}$C from ambience, a heater surface was coated with diamond-like carbon having a concentration of the carbon isotope $^{12}$C not lower than 99.9%.

Then, a diamond synthesis system in which a seed crystal, a solvent, and isotope-enriched graphite as the carbon source are arranged sequentially from below is enclosed with a cup-shaped cell made of Fe and not containing carbon and Ni, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of a carbon isotope $^{12}C$ was 99.9 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 140 GPa, which was found to be higher than 90 to 120 GPa which was hardness of conventional single-crystal diamond synthesized in similar steps except for a source material and a seed crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In addition, hardness thereof is approximately 60 to 70 GPa at the highest. In contrast, in single-crystal diamond in the present example, this threshold temperature was also higher than 250° C., in some single crystals, lowering in hardness was hardly observed even when a temperature exceeded 450° C., and plastic deformation did not occur up to 600° C. at which diamond burns in atmosphere. Thus, the finding that hardness characteristics at a high temperature were also better than those of the conventional diamond was obtained.

Example 22

Nitrogen is removed from a methane gas by passing the methane gas in which a concentration of a carbon isotope $^{12}C$ is 99.99% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.99%, was formed. Here, a pressure in the vacuum chamber was set approximately to $10^2$ to $10^4$ Pa. Since it has been known through experiments so far that hydrogen had been introduced in this diamond, diamond for a carbon source was subjected to heating treatment from 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, a high-purity Fe—Co—Ti alloy not containing Ni is prepared as a solvent for diamond synthesis. In addition, high-purity graphite in which an isotope has been enriched is prepared as a carbon source. In order to prevent introduction of a carbon isotope $^{13}C$ from ambience, a heater surface was coated with diamond-like carbon having a concentration of the carbon isotope $^{12}C$ not lower than 99.99%.

Then, a diamond synthesis system in which a seed crystal, a solvent, and high-purity graphite as the carbon source, in which an isotope has been enriched, are arranged sequentially from below is enclosed with a cup-shaped cell made of Fe and not containing carbon and Ni, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of a carbon isotope $^{12}C$ was 99.99 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 142 GPa, which was found to be higher than 90 to 120 GPa which was hardness of conventional single-crystal diamond which was a high-purity crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, this threshold temperature was also as high as 300° C. and high-temperature characteristics were also better than those of the conventional diamond, was obtained.

Example 23

Nitrogen is removed from a methane gas by passing the methane gas in which a concentration of a carbon isotope $^{12}C$ is 99.999% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}C$ was not lower than 99.999%, was formed. Here, a pressure in the vacuum chamber was set approximately to $10^2$ to $10^4$ Pa. Since it has been known through experiments so far that hydrogen had been introduced in this diamond, diamond for a carbon source was subjected to heating treatment from 1800° C. to 2000° C. and obtained solid was employed as a carbon-isotope-$^{12}C$-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, a high-purity Fe—Co—Ti alloy not containing Ni is prepared as a solvent for diamond synthesis. In addition, high-purity graphite in which an isotope has been enriched is prepared as a carbon source. In order to prevent introduction of a carbon isotope $^{13}C$ from ambience, a heater surface was coated with diamond-like carbon having a concentration of the carbon isotope $^{12}C$ not lower than 99.999%.

Then, a diamond synthesis system in which a seed crystal, a solvent, and high-purity graphite as the carbon source, in which an isotope has been enriched, are arranged sequentially from below is enclosed with a cup-shaped cell made of Fe and not containing carbon and Ni, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of a carbon isotope $^{12}$C was 99.99 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 143 GPa, which was found to be higher than 90 to 120 GPa which was hardness of conventional single-crystal diamond which was a high-purity crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, the finding that, in single-crystal diamond in the present example, this threshold temperature was also as high as 300° C. and high-temperature characteristics were also better than those of the conventional diamond, was obtained.

Example 24

Nitrogen is removed from a methane gas by passing the methane gas in which a concentration of a carbon isotope $^{12}$C is 99.999% through sponge titanium heated to 600° C. or higher. This methane gas from which nitrogen has been removed is introduced in a vacuum chamber, with 1 to 3% hydrogen being mixed therein. A temperature of a filament was fixed to 2000° C. and a single crystal was synthesized on a diamond substrate (a substrate temperature from 800° C. to 900° C.). Thus, a diamond single crystal for a carbon source having a size of 10 mm×10 mm, in which a concentration of the carbon isotope $^{12}$C was not lower than 99.995%, was formed. The reason why a degree of enrichment slightly lowered is considered to be because of introduction of air in a cell. Here, a pressure in the vacuum chamber was set approximately to $10^2$ to $10^4$ Pa. Since it has been known through experiments so far that hydrogen had been introduced in this diamond, diamond for a carbon source was subjected to heating treatment from 1800° C. to 2000° C. and obtained solid was employed as a carbon-isotope-$^{12}$C-enriched carbon source.

The carbon source above was used to synthesize a diamond single crystal through high-temperature and high-pressure synthesis once, the isotope-enriched surface high-purity diamond was observed with a polarizing microscope, a portion in a (100) plane extremely low in strain, having a size not smaller than 0.5 mm×0.5 mm, was cut, and this portion was employed as a seed crystal.

On the other hand, a high-purity Fe—Co—Ti alloy not containing Ni is prepared as a solvent for diamond synthesis. In addition, graphite in which an isotope has been enriched is prepared as a carbon source. In order to prevent introduction of a carbon isotope $^{13}$C from ambience, a heater surface was coated with diamond-like carbon having a concentration of the carbon isotope $^{12}$C not lower than 99.999%.

Then, a diamond synthesis system in which a seed crystal, a solvent, and high-purity graphite as the carbon source, in which an isotope has been enriched, are arranged sequentially from below is enclosed with a cup-shaped cell made of Fe and not containing carbon and Ni, and an upper surface thereof is sealed in vacuum not higher than $10^{-3}$ Pa.

Then, single-crystal diamond is grown from the seed crystal at a high temperature of 1300° C. and at a high pressure of 5.5 GPa. Consequently, single-crystal diamond in which a concentration of a carbon isotope $^{12}$C was 99.999 mass %, a concentration of nitrogen was not higher than 0.0001 mass %, a concentration of hydrogen was lower than 0.01%, and a concentration of boron was not higher than 0.0001% could be obtained. This single-crystal diamond had hardness of 150 GPa, which was found to be higher than 90 to 120 GPa which was hardness of conventional single-crystal diamond which was a high-purity crystal and composed of a carbon isotope at a ratio as high as a natural abundance ratio.

In addition, based on measurement of Knoop hardness in a <110> direction in a (001) plane of single-crystal diamond, a conventional diamond crystal has a threshold value in a range from 200 to 230° C. and indentation appears. In contrast, in single-crystal diamond in the present example, with regard to this threshold temperature as well, plastic deformation did not occur until 400° C. was exceeded. Thus, the finding that high-temperature characteristics were also better than those of the conventional diamond was obtained.

A methane gas in which a concentration of a carbon isotope $^{12}$C was 99.999% was used to synthesize single-crystal diamond with the CVD method. This single-crystal diamond was employed as a source material and a solvent containing Ni by 0.001% was used to grow single-crystal diamond with a high-temperature and high-pressure method. Though substantially no impurity such as nitrogen and boron was introduced in obtained single-crystal diamond, Ni was present by approximately 0.0001 mass % or more. Hardness of the single-crystal diamond in the present Comparative Example was approximately 120 GPa, and at a high temperature, the single-crystal diamond plastically deformed at 180° C. Thus, it was found that single-crystal diamond not containing Ni in the present Example was less likely to plastically deform until a temperature was high.

Though embodiments and examples of the present invention have been described above, improvement in hardness and improvement in temperature dependency of hardness are attributed to decrease in such an impurity as serving as a starting point of plastic deformation. In addition, though higher hardness as such leads to an extremely small ESR line width of the P1 center, this is estimated to be because of lowering in an impurity and strain.

The embodiments and the examples described above can also variously be modified. In addition, the scope of the present invention is not limited to the embodiments and the examples described above. The scope of the present invention is defined by the terms of the claims and is intended to include any modifications within the scope and meaning equivalent to the terms of the claims.

The invention claimed is:
1. Single-crystal diamond, comprising:
  carbon in which a concentration of a carbon isotope $^{12}$C is not lower than 99.9 mass %; and
  nitrogen, boron, hydrogen, and nickel,
  a total content of nitrogen, boron, and hydrogen being not higher than 0.01 mass %,
  a content of said hydrogen being lower than 0.01 mass %, and a threshold value at which lowering in Knoop hardness occurs in a <110> direction in a (001) plane of a single crystal exceeding 240° C.

2. The single-crystal diamond according to claim 1, wherein
a content of said nitrogen and said boron is lower than a content of said hydrogen.

3. The single-crystal diamond according to claim 1, wherein
said nitrogen is not higher than 0.0001 mass %, said boron is not higher than 0.0001 mass %, and said nickel is not higher than 0.00001 mass %.

4. The single-crystal diamond according to claim 1, having Knoop hardness not lower than 130 GPa.

5. Single-crystal diamond, comprising:
carbon in which a concentration of a carbon isotope $^{12}C$ is not lower than 99.9 mass %; and
nitrogen, boron, and hydrogen,
nickel not being included,
a total content of nitrogen, boron, and hydrogen-being not higher than 0.01 mass %,
a content of said hydrogen being lower than 0.01 mass %, and
a threshold value at which lowering in Knoop hardness occurs in a <110> direction in a (001) plane of a single crystal being equal to or higher than 400° C.

6. The single-crystal diamond according to claim 5, wherein
a content of said nitrogen and said boron is lower than a content of said hydrogen.

7. The single-crystal diamond according to claim 5, wherein
said nitrogen is not higher than 0.0001 mass %, and said boron is not higher than 0.0001 mass %.

8. The single-crystal diamond according to claim 5, having Knoop hardness not lower than 140 GPa.

* * * * *